United States Patent
Menniti et al.

[11] Patent Number: 6,028,468
[45] Date of Patent: Feb. 22, 2000

[54] VOLTAGE-LEVEL SHIFTER

[75] Inventors: Pietro Menniti, Milan; Aldo Novelli, S. Lorenzo Di Parabiago, both of Italy

[73] Assignee: STMicroelectronics S.r. l., Agrate Brianza, Italy

[21] Appl. No.: 08/749,414

[22] Filed: Nov. 15, 1996

Related U.S. Application Data

[63] Continuation of application No. 08/422,697, Apr. 14, 1995, abandoned.

[30] Foreign Application Priority Data

Apr. 15, 1994 [EP] European Pat. Off. ............. 94830180

[51] Int. Cl.⁷ ............................................. H03K 19/0185
[52] U.S. Cl. ............................... 327/333; 326/62; 326/80
[58] Field of Search ....................... 327/306, 319, 327/331, 332, 333; 326/62, 63, 68–78, 80, 81, 82–84, 89

[56] References Cited

U.S. PATENT DOCUMENTS

| | | | |
|---|---|---|---|
| 4,453,092 | 6/1984 | Joseph | 327/333 |
| 4,464,631 | 8/1984 | Prentice | 330/253 |
| 4,492,882 | 1/1985 | Jensen et al. | 327/333 |
| 4,825,110 | 4/1989 | Yamaguchi et al. | 307/530 |
| 4,996,443 | 2/1991 | Tateno | 327/333 |
| 5,019,729 | 5/1991 | Kimura et al. | 329/91 |
| 5,095,284 | 3/1992 | Mead | 330/253 |
| 5,113,097 | 5/1992 | Lee | 326/81 |
| 5,317,213 | 5/1994 | Sato et al. | 326/63 |
| 5,343,083 | 8/1994 | Fuse | 327/333 |
| 5,367,212 | 11/1994 | Rabii | 327/306 |
| 5,371,421 | 12/1994 | Konbloh et al. | 326/73 |
| 5,381,059 | 1/1995 | Douglas | 326/68 |
| 5,399,915 | 3/1995 | Yahata | 327/333 |
| 5,424,659 | 6/1995 | Van Brunt et al. | 326/63 |
| 5,448,183 | 9/1995 | Koreeda | 326/78 |

FOREIGN PATENT DOCUMENTS

| | | |
|---|---|---|
| 0 096 349 | 12/1983 | European Pat. Off. . |
| 0 159 257 | 10/1985 | European Pat. Off. ........ G01R 19/00 |
| 446652 | 9/1991 | European Pat. Off. ............... 330/257 |
| 0 485 291 | 5/1992 | European Pat. Off. ... H03K 19/0175 |
| 0501085 | 9/1992 | European Pat. Off. ............... 327/333 |
| 359214325 | 12/1984 | Japan ................... 327/333 |
| 0086905 | 5/1985 | Japan ................... 330/257 |
| 60-4331 | 10/1985 | Japan . |
| 2162824 | 6/1990 | Japan ................... 327/384 |
| 404245706 | 9/1992 | Japan ................... 330/257 |
| 0134506 | 7/1995 | Japan ................... 330/257 |
| 3-135220 | 10/1997 | Japan . |

*Primary Examiner*—Tuan T. Lam
*Attorney, Agent, or Firm*—Theodore E. Galanthay; E. Russell Tarleton; Seed and Berry LLP

[57] ABSTRACT

A level shift circuit for a voltage input signal (S, SN) presenting at least a first and a second high-voltage levels, the circuit comprising two parallel branches, each formed by a current modulator and a signal converter. The current modulators are supplied with two signals in phase opposition to each other, and generate current signals whose value depends on the level of the respective input signal; and the signal converters convert the current signals into ground-related voltage signals. The signal converters together form a single-ended differential circuit, the output of which therefore presents a low-voltage digital signal which can be processed by normal digital circuits and is unaffected by noise or variations in supply voltage.

21 Claims, 2 Drawing Sheets

VOLTAGE-LEVEL SHIFTER

CROSS-REFERENCE TO RELATED APPLICATION

This application is a continuation of U.S. patent application No. 08/422,697, filed Apr. 14, 1995, now abandoned.

TECHNICAL FIELD

The present invention relates to a high-to-low-voltage signal level shift circuit, in particular a circuit for low voltage shifting a digital signal which may assume two different values close to a high supply voltage.

BACKGROUND OF THE INVENTION

Modern electronic circuits sometimes require that a high-voltage-related signal (even as high as 500 V) be converted to a signal that is low voltage compatible with normal digital circuits (typically operating between 0 and 5 V). Such is the case, for example, with low-side or high-side power MOS transistor drivers which supply digital diagnostic signals (e.g. relative to short-circuiting, correct open/close operation of the power MOS transistor, etc.) which may selectively assume two different high-voltage-related levels (e.g. 500 and 495 V), and the level of which must therefore be shifted and related to ground for the signals to be processed by normal digital circuits, e.g. microprocessor systems.

In some cases, the need arises for a shift circuit including active, low breakdown voltage components, as, for example, when the fabrication technology available does not permit the use or formation of PNP bipolar or P-channel MOS transistors capable of withstanding the high input voltage.

SUMMARY OF THE INVENTION

It is an object of the present invention to provide a voltage shift circuit capable of operating even at the aforementioned high voltages, and supplying at the output a ground-related signal coding the same information as the high-voltage-related signal at the input.

In accordance with one aspect of the present invention, a voltage-level shifter is provided. A current modulator receives an input signal having first and second voltage levels associated with a first reference level, and generates an intermediate signal having first and second current levels corresponding to the first and second voltage levels. A current-to-voltage converter receives the intermediate signal and generates an output signal having third and fourth voltage levels. The third and fourth voltage levels correspond to the first and second voltage levels and are associated with a second reference level that is of a significantly lower voltage than the first reference level.

In accordance with another aspect of the invention, the current modulator includes a voltage divider and a switch element. The voltage divider includes an input terminal for receiving the first reference level, an output terminal for providing the intermediate signal, a first component coupled to the input terminal, and a second component serially coupled between the first component and the output terminal. The switch element shunts the first component and receives the input signal.

In accordance with yet another aspect of the invention, the shifter includes a reference circuit coupled in parallel with the series combination of the modulator and the converter to form a single-ended differential circuit. This differential circuit includes a current source and a reference converter. In a related aspect of the invention, the current source includes a reference modulator having a reference voltage divider and a reference switch element that receives a control signal in phase opposition to the input signal. In another related aspect of the invention, the current-to-voltage converter and the reference converter are coupled to form a current mirror.

In accordance with still another aspect of the invention, a comparator has a first input coupled to the current-to-voltage converter and a second input coupled to the reference converter. The current-to-voltage converter includes a first resistor coupled in series with the modulator, and the reference converter includes a second resistor coupled in series with the current source.

BRIEF DESCRIPTION OF THE DRAWINGS

A number of non-limiting embodiments of the present invention will be described by way of example with reference to the accompanying drawings, in which.

DETAILED DESCRIPTION OF THE INVENTION

Figure 1:
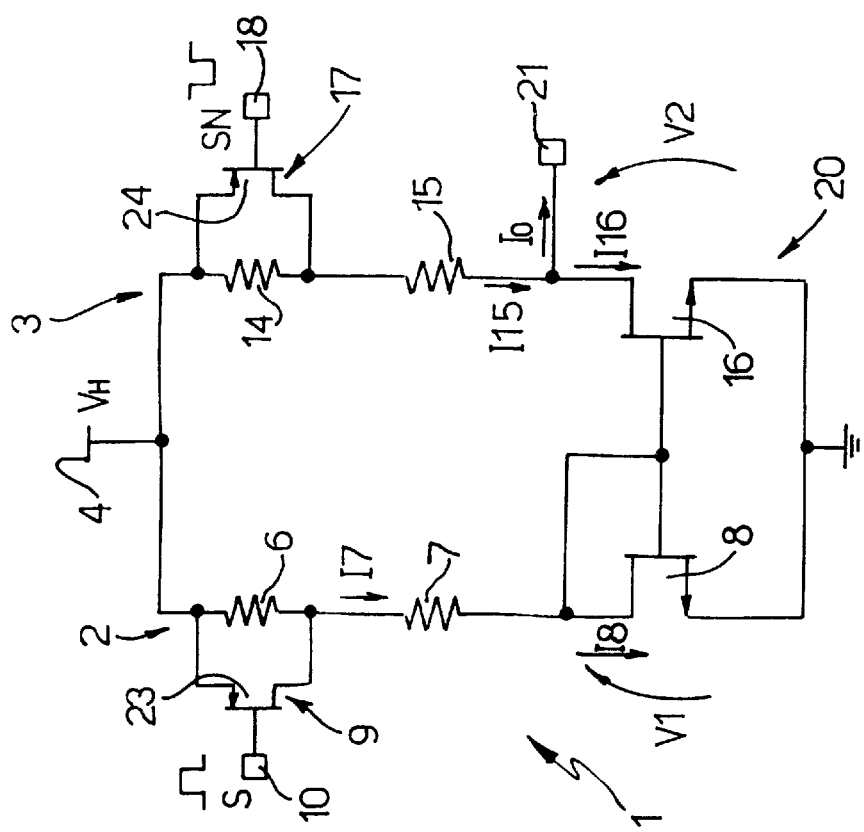
FIG. 1 shows a first embodiment of a circuit according to the present invention.

Number 1 in FIG. 1 indicates a shift circuit comprising a first and second branch 2 and 3 connected in parallel between a supply line 4 at a high voltage $V_H$ (e.g. 500 V) and ground. Branch 2 comprises a first and second resistor 6 and 7, and a first transistor 8, here an N-channel MOS type, connected to one another in series. A first controlled switch 9 is provided parallel to first resistor 6 (which has one end connected to supply line 4), and receives a supply-related digital signal S supplied to a terminal 10. Similarly, branch 3 comprises a third and fourth resistor 14 and 15, and a second transistor 16, again an NMOS type, also connected to one another in series. A second controlled switch 17 is provided parallel to third resistor 14 (which has one end connected to supply line 4), and is supplied with a digital signal SN in phase opposition to, i.e., which is the inversion of, signal S, and is supplied to a terminal 18. Signal SN is also supply-related. For example, when S assumes a value of 500 V, SN assumes a maximum value of 495 V, and vice versa.

Transistor 8 is diode connected, i.e. presents the drain terminal (connected to resistor 7) connected to the gate terminal. The source terminals of transistors 8 and 16 are grounded, and the gate terminals are connected to each other to form a current mirror circuit 20. The drain terminal of transistor 16 is connected to fourth resistor 15, and forms an output node 21 of circuit 1.

Switches 9 and 17 are formed in this case by PMOS transistors 23 and 24, with their source terminals connected to supply line 4, their drain terminals connected to the intermediate nodes between resistors 6 and 7 and 14 and 15 respectively, and the gate terminals connected respectively to terminals 10 and 18.

In circuit 1, S and SN are the high-voltage digital signals to be shifted to low voltage signals, while at the same time maintaining the digital information coded by them.

If I7 is the current through resistor 7; I15 the current through resistor 15; I8 the current through transistor 8; and I16 the current through transistor 16:

$$I7=I8=(\mu Cox)/2(W/L)(V_{GS}-V_T)^2$$

where $\mu$ is the permeability coefficient; Cox the capacitance of the oxide layer; (W/L) the width/length ratio; $V_{GS}$ the gate-source voltage and $V_T$ the threshold voltage of transistor 8.

If transistor 16 is the same as transistor 8 (same technology and W/L ratio):

$$I8=I16$$

Resistors 6, 7, 14, and 15 are sized so that their resistances R6, R7, R14, and R15 conform with the following equation:

$$R6+R7=R14+R15$$

In this case, in the balanced condition with switches 9 and 17 open, if V1 and V2 are the voltages with respect to ground of the drain terminals of transistors 8 and 16, respectively, it results V1=V2, and I7=I15.

If voltage $V_H$ is much higher than the source-gate voltage drop VGS of transistor 8, current I8 may also be given by the following equation:

$$I8=I7=V_H/(R6+R7) \qquad (1)$$

Controlling switches 9 and 17 by means of phase-opposed signals S and SN, in a first operating mode (S high, SN low), switch 9 is open and switch 17 closed; and in a second operating mode (S low, SN high), switch 9 is closed and switch 17 open.

More specifically, when switch 9 is open and switch 17 closed, resistor 14 is bypassed, so that:

$$V2=V_H-R15*I15 \qquad (2)$$

In this case, current I7 is given by equation (1). By appropriately sizing resistors 6, 7, 14, and 15 (e.g. so that ratio R6/R7–R14/R15=1/100), in the first operating mode, current I15 presents a value close to but higher than the balanced value given by (1); and, since I8=I16, the output current $I_O$ of circuit 1, given by:

$$I_O=I15-I16=I15-I7 \qquad (3)$$

is therefore positive.

Conversely, in the second operating mode with switch 9 closed and switch 17 open, resistor 6 is bypassed, so that:

$$V2=V_H-(R14+R15)*I15 \qquad (4)$$

and:

$$I7=I8=V_H/R7 \qquad (5)$$

Consequently, in the second operating mode, and by virtue of the sizing of resistors 6, 7, 14, 15, current I15 is slightly less than the balanced current, so that $I_O$ is negative.

By means of appropriate sizing, it is also possible, in the second operating mode wherein (4) applies, to obtain:

$$V2<(V_{GS}-V_T)$$

so that transistor 16 operates in the linear region.
In which case:

$$V2=Ron*I16=Ron*I8$$

where Ron is the equivalent resistance of transistor 16 in the linear region.

The circuit may therefore by operated so that voltage V2 assumes two widely differing values, i.e. two ground-related digital values, in the first and second operating modes, thus permitting signal V2 to be used directly by normal digital circuits.

In other words, the shift circuit according to the present invention provides for shifting the high-voltage signal S or SN by means of an element (controlled switch 9 or 17 and resistors 6 and 7 or 14 and 15) which modulates a current so that it presents two different values, depending on the digital value of the high-voltage signal, and may thus be converted to a voltage compatible with normal digital circuits. The FIG. 1 circuit also presents a differential circuit (current mirror 20) for obtaining a differential current value (equal to the difference between the modulated value and a reference value generated by branch 2) so that the circuit is unaffected by variations or noise in the signal, e.g. for obtaining comparable output voltages even in the event of variations in supply voltage $V_H$.

PMOS transistors 23 and 24 may be low-voltage types. In fact, by appropriately sizing resistors 6, 7, 14, and 15, the drain-source voltage drop of transistors 23 and 24 may be made less than the breakdown voltage (BVdss); and, similarly, the drain-source voltage drop of transistors 8 and 16 may be such as not to exceed their breakdown voltages; thus enabling circuit 1 to be formed using only low-voltage components, which, in addition to enabling implementation of the shift circuit even when high-voltage elements cannot be employed, also provides for considerable space savings.

Figure 2:
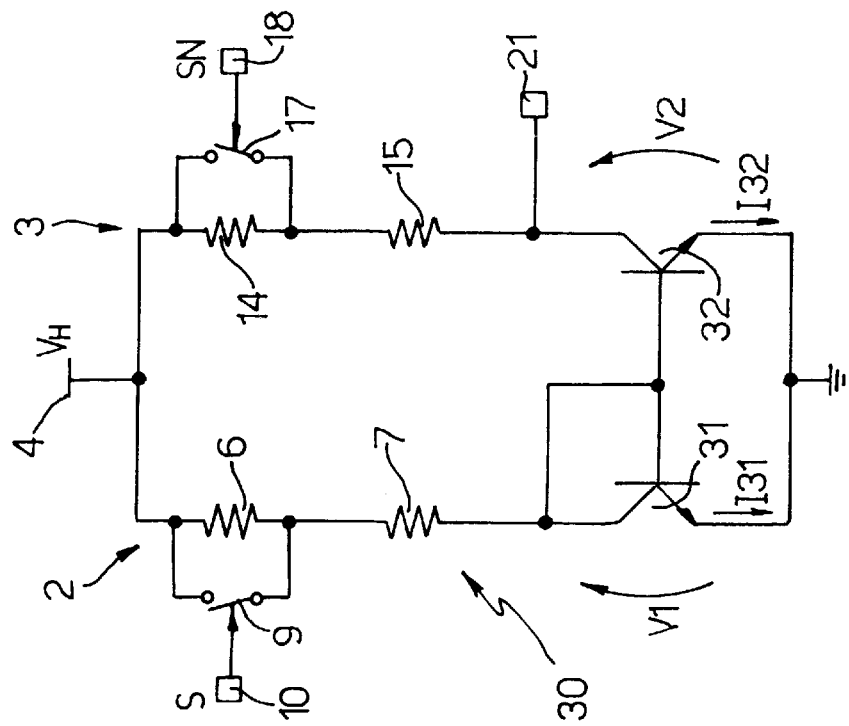
FIG. 2 shows a second embodiment of a circuit according to the present invention.

Circuit 30 in FIG. 2 is the same as the FIG. 1 circuit, with the exception of current mirror circuit 20 which, in this case, comprises two bipolar NPN transistors 31 and 32. More specifically, transistor 31 forms part of branch 2, and presents the collector terminal connected to second resistor 7, to its own base terminal, and to the base terminal of transistor 32 which in turn presents the collector terminal connected to output node 21 and to fourth resistor 15. The emitter terminals of both transistors are grounded.

The rest of circuit 30 is similar to circuit 1 in both structure and operation and therefore requires no further description.

In circuit 30, the ratio between reference current I31 (in branch 2) and current I32 in transistor 32 is determined by the emitter area ratio of transistors 31 and 32.

Also, current I31 is given by the equation:

$$I31=(V_H-V_{BE})/(R6+R7)$$

where $V_{BE}$ is the base-emitter voltage drop of transistor 31; and R6, R7 have the same significance as indicated above. More specifically, if $V_{BE}<<V_H$, it may be disregarded, and current I31 is given by the equation:

$$I31=V_H/(R6+R7)$$

Equations (2) and (4) indicated above also apply to circuit 30.

Figures 3, 4:
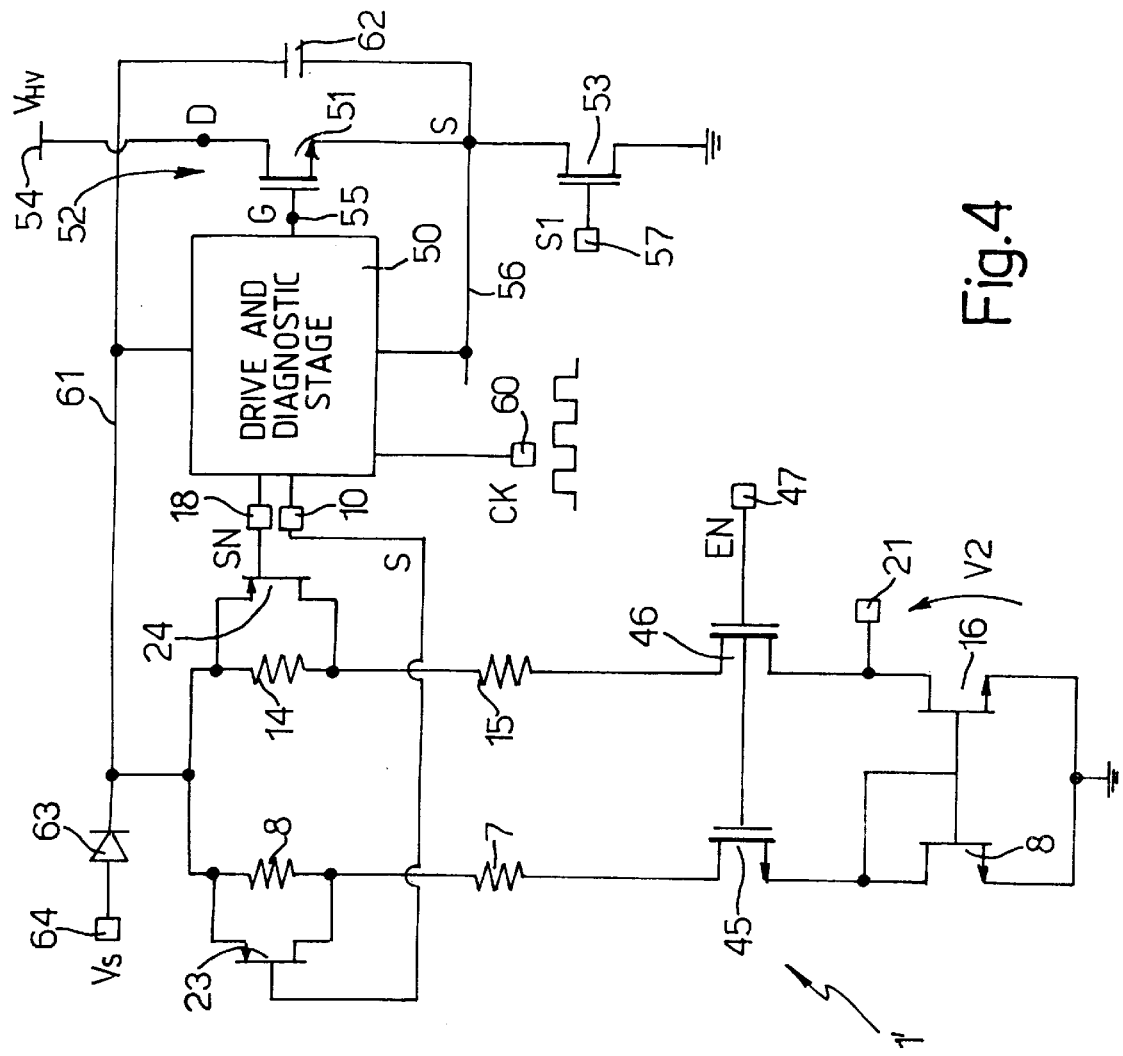
FIG. 3 shows a third embodiment of a circuit according to the present invention.
FIG. 4 shows a fourth embodiment of a circuit according to the present invention and a half-bridge power MOS transistor driver with which the circuit is used.

Circuit 35 in FIG. 3 is similar to circuits 1 and 30, with the exception of the differential element. In this case, mirror 20 is replaced by a comparator 36, the inputs of which are connected to a fifth and a sixth resistor 37 and 38 in place of transistors 8 and 16 or 31 and 32.

More specifically, in FIG. 3, fifth resistor 37 is located in series with resistors 6 and 7; and a terminal of resistor 37 connected to resistor 7 to define node 39, which is connected to the noninverting input of comparator 36. Sixth resistor 38 is located in series with resistors 14 and 15; and a terminal of resistor 38 connected to resistor 15 to define node 40, which is connected to the inverting input of comparator 36, the output 41 of which defines the output of circuit 35.

In circuit 35, current I15 in branch 3 depends solely on the value of resistors 14, 15 and 38, and obviously differs according to whether switch 17 is open or closed (high or low signal SN). Current I15 is compared with the current I7 (reference current) in branch 2 by comparator 36, the output 41 of which therefore presents a ground-related digital signal, the value of which depends on the digital value of (supply-related) signal SN.

The FIG. 4 embodiment is similar to that of FIG. 1, but more complete and applied to a half-bridge power MOS driver.

More specifically, in circuit 1' in FIG. 4, a first high-voltage DMOS transistor 45 is interposed between resistor 7 and the drain terminal of transistor 8; a second high-voltage DMOS transistor 46 is interposed between the drain terminal of transistor 16 and resistor 15; and DMOS transistors 45 and 46 present the gate terminals connected to each other and to an input terminal 47 supplied with a digital signal EN for turning the DMOS transistors on or off and so enabling or disabling circuit 1'.

DMOS transistors 45 and 46 therefore provide for limiting the power consumption of circuit 1' when the shifted digital information at output 21 is not required; and are in the form of high-voltage components in that, when the circuit is turned off, the terminals connected respectively to resistors 7 and 15 present a high impedance and may assume values equal to the supply voltage ($V_S$ in the FIG. 4 example).

In the FIG. 4 embodiment, the gate terminals of transistors 23 and 24 forming switches 9 and 17 (terminals 10, 18) are connected to two outputs of a drive and diagnostic stage 50 controlling the upper transistor 51 of a half-bridge stage 52 also including a lower transistor 53 which, alternatively, may be replaced by a load.

More specifically, transistor 51 is an N-channel power transistor with the drain terminal connected to supply line 54 at voltage $V_{HV}$, the gate terminal connected to the control output 55 of stage 50, and the source terminal connected to a source line 56 to which are connected both stage 50 and the drain terminal of lower transistor 53. Lower transistor 53 is also an N-channel power transistor, and presents a grounded source terminal, and a gate terminal 57 supplied with a drive signal S1 generated by a drive stage (not shown) separate from stage 50.

Drive and diagnostic stage 50 also presents an input connected to a terminal 60 supplied with a clock signal CK for driving MOS transistor 51, and is connected to a high-voltage supply line 61 to which shift circuit 1' is also connected. A bootstrap capacitor 62 is located between the source terminal of upper transistor 51 and supply line 61; and a diode 63, with its cathode connected to line 61, is interposed between line 61 and a terminal 64 supplied with supply voltage $V_S$.

In known manner, drive stage 50 in the FIG. 4 circuit generates at terminal 55 a drive signal oscillating between $V_S$ and $V_S+V_{HV}$, depending on the level of clock signal CK; and, again in known manner, diagnostic tests half-bridge stage 52 to determine correct operation of upper transistor 51, any short-circuiting to ground of line 56 (source terminal of transistor 51), etc., and generates at the output a high-voltage-related digital signal. More specifically, in the example shown, stage 50 generates the two phase-opposed signals S and SN supplied to terminals 10 and 18, the level of which therefore codes correct operation or a defect of half-bridge stage 52.

Circuit 1' thus provides for shifting signals S and SN, as described in detail above, for obtaining information usable, for example, by a microprocessor system.

The advantages of the circuit according to the present invention will be clear from the foregoing description.

Clearly, changes may be made to the circuit as described and illustrated herein without, however, departing from the spirit and scope of the present invention. In particular, in its most general form, the invention may comprise only one voltage shift branch, as described above; switches 9 and 17 may be replaced by the others technically equivalent to them; and the output circuit for converting the modulated current into voltage may be formed in various ways.

We claim:

1. A level shift circuit comprising:

a voltage input signal presenting at least a first voltage level and a second voltage level for coding information;

said first voltage level substantially equal to a first supply voltage;

a magnitude of a first difference between said first and second voltage levels being five volts or less;

said level shift circuit having a signal current modulating means supplied with said voltage input signal and generating a current signal having a first current value and a second current value related to said first and second voltage levels of said input voltage signal, respectively, said signal current modulating means comprising a signal voltage divider connected between a first supply line at said first supply voltage, and a second supply line at a second supply voltage; said signal voltage divider comprising at least a first and a second electric component connected to each other in series and coupled respectively to said first and said second supply lines; said signal current modulating means also comprising a signal controlled switch element having a control terminal supplied with said input signal and being arranged in parallel to said first electric component; and signal converting means supplied with said current signal and generating a voltage output signal presenting at least a third voltage level and a fourth voltage level; said third and fourth voltage levels being five volts or less, a magnitude of a second difference between said third and fourth voltage levels being five volts or less.

2. A circuit as claimed in claim 1, wherein said level shift circuit further comprises a reference branch parallel to said signal voltage divider; said reference branch including current source means coupled in series with reference converting means; and said reference converting means and signal converting means forming a single-ended differential circuit.

3. A circuit as claimed in claim 2, wherein said current source means comprise reference modulating means including a reference voltage divider having a resistive element coupled in parallel with a reference controlled switch element; said reference controlled switch element presenting a control terminal supplied with a signal in phase opposition to said voltage input signal.

4. A circuit as claimed in claim 3, wherein said signal controlled switch element and said reference controlled switch element each comprise a MOS transistor.

5. A circuit as claimed in claim 4, wherein said MOS transistor is a P-channel type, and presents the source terminal connected to said first supply voltage.

6. A circuit as claimed in claim 3, wherein said first and second electric components of said signal voltage divider comprise resistive elements.

7. A circuit as claimed in claim 2, wherein said single-ended differential circuit is a current mirror circuit.

8. A circuit as claimed in claim 7, wherein said current mirror circuit comprises NMOS transistors.

9. A circuit as claimed in claim 7, wherein said current mirror circuit comprises bipolar transistors.

10. A circuit as claimed in claim 3, wherein said single-ended differential circuit comprises a first and a second resistor connected in series with said signal voltage divider and said reference voltage divider respectively; and a comparing element having a first and second input connected to said first and second resistors.

11. The circuit of claim 1, wherein said voltage input signal includes a digital signal referenced to said first supply voltage and generated by a drive and diagnostic circuit for a power transistor.

12. A voltage-level shifter, comprising:
 a current modulator operable to receive an input signal having first and second voltage levels, said first voltage level substantially equal to a first reference voltage level a first difference between said first and second voltage levels being comparable to normal digital signal voltages, said current modulator operable to generate an intermediate signal having first and second current levels corresponding to said first and second voltage levels; and
 a current-to-voltage converter operable to receive said intermediate signal and to generate an output signal having third and fourth voltage levels corresponding to said first and second voltage levels, respectively, a second difference between said third and fourth voltage levels being comparable to said normal digital signal voltages, wherein said current modulator further comprises:
  a voltage divider, comprising,
   an input terminal operable to receive said first reference voltage level;
   an output terminal operable to provide said intermediate signal;
   a first component coupled to said input terminal;
   a second component serially coupled between said first component and said output terminal; and
   a switch element shunting said first component and operable to receive said input signal.

13. The shifter of claim 12, further comprising:
 a reference circuit coupled in parallel with the series combination of said current modulator and said current-to-voltage converter to form a single-ended differential circuit, said reference circuit comprising,
 a current source, and
 a reference converter coupled in series with said current source.

14. A voltage-level shifter comprising:
 a current modulator operable to receive an input signal having first and second voltage levels, said first voltage level substantially equal to a first reference voltage level, a first difference between said first and second voltage levels being comparable to normal digital signal voltages, said current modulator operable to generate an intermediate signal having first and second current levels corresponding to said first and second voltage levels;
 a current-to-voltage converter operable to receive said intermediate signal and to generate an output signal having third and fourth voltage levels corresponding to said first and second voltage levels, respectively, a second difference between said third and fourth voltage levels being comparable to said normal digital signal voltages;
 a reference circuit coupled in parallel with the series combination of said current modulator and current-to-voltage converter to form a single-ended differential circuit, said reference circuit comprising,
 a current source, and
 a reference converter coupled in series with said current source, wherein said current source comprises:
  a reference modulator, comprising,
   a reference voltage divider, and
   a reference switch element coupled in parallel with one member of said reference voltage divider and operable to receive a control signal in phase opposition to said input signal.

15. The shifter of claim 14 wherein said current-to-voltage converter and said reference converter are coupled to form a current mirror.

16. A voltage-level shifter comprising:
 a current modulator operable to receive an input signal having first and second voltage levels, said first voltage level substantially equal to a first reference voltage level, a first difference between said first and second voltage levels being comparable to normal digital signal voltages, said current modulator operable to generate an intermediate signal having first and second current levels corresponding to said first and second voltage levels;
 a current-to-voltage converter operable to receive said intermediate signal and to generate an output signal having third and fourth voltage levels corresponding to said first and second voltage levels, respectively, a second difference between said third and fourth voltage levels being comparable to said normal digital signal voltages;
 a reference circuit coupled in parallel with the series combination of said current modulator and current-to-voltage converter to form a single-ended differential circuit, said reference circuit comprising a current source and a reference converter coupled in series with said current source;
 a comparator having a first input coupled to said current-to-voltage converter and a second input coupled to said reference converter;
 wherein said current-to-voltage converter includes a first resistor coupled in series with said current modulator; and
 wherein said reference converter includes a second resistor coupled in series with said current source.

17. A circuit comprising:
 a power transistor:
 a drive and diagnostic circuit operable to drive said power transistor and to generate a control signal having first and second voltage levels, said first voltage level substantially equal to a reference voltage level, the absolute value of a first difference between said first and second voltage levels being comparable to digital signal voltages;
 a current modulator operable to receive said control signal and to generate an intermediate signal having first and second current levels corresponding to said first and second voltage levels; and
 a current-to-voltage converter operable to receive said intermediate signal and to generate an output signal having third and fourth voltage levels corresponding respectively to said first and second voltage levels, an absolute value of a second difference between said third and fourth voltage levels being comparable to said digital signal voltages, wherein said current modulator further comprises:

a voltage divider, comprising,
  an input terminal operable to receive said first reference level,
  an output terminal operable to provide said intermediate signal,
  a first component coupled to said input terminal, and
  a second component serially coupled between said first component and said output terminal; and
  a switch element shunting said first component and operable to receive said control signal.

18. A circuit, comprising:

a power transistor, a drive and diagnostic circuit operable to drive said power transistor and to generate a control signal having first and second voltage levels, said first voltage level substantially equal to a reference voltage level, an absolute value of a first difference between said first and second voltage levels being approximately 1% or less of said reference voltage level;

a current modulator operable to receive said control signal and to generate an intermediate signal having first and second current levels corresponding to said first and second voltage levels; and a current-to-voltage converter operable to receive said intermediate signal and to generate an output signal having third and fourth voltage levels corresponding respectively to said first and second voltage levels, an absolute value of a second difference between said third and fourth voltage levels being approximately 1% of said reference voltage level.

19. A circuit, comprising:

a power transistor;

a drive and diagnostic circuit operable to drive said power transistor and to generate a control signal having first and second voltage levels, said first voltage level substantially equal to a reference voltage level, an absolute value of a first difference between said first and second voltage levels being approximately 1% or less of said reference voltage level;

a current modulator operable to receive said control signal and to generate an intermediate signal having first and second current levels corresponding to said first and second voltage levels; and a current-to-voltage converter operable to receive said intermediate signal and to generate an output signal having third and fourth voltage levels corresponding respectively to said first and second voltage levels, said third voltage level and an absolute value of a second difference between said third and fourth voltage levels being approximately 1% of said reference voltage level.

20. A circuit, comprising:

a power transistor;

a drive and diagnostic circuit operable to drive said power transistor and to generate a control signal having first and second voltage levels, said first voltage level substantially equal to a reference voltage level, the absolute value of a first difference between said first and second voltage levels being approximately 1% or less of said reference voltage level;

a current modulator operable to receive said control signal and to generate an intermediate signal having first and second current levels corresponding to said first and second voltage levels; and a current-to-voltage converter operable to receive said intermediate signal and to generate an output signal having third and fourth voltage levels corresponding respectively to said first and second voltage levels, an absolute value of a second difference between said third and fourth voltage levels being approximately 1% or less of said reference voltage level.

21. A circuit comprising:

a power transistor;

a drive and diagnostic circuit operable to drive said power transistor and to generate a control signal having first and second voltage levels, said first voltage level substantially equal to a reference voltage level the absolute value of a first difference between said first and second voltage levels being comparable to digital signal voltages;

a current modulator operable to receive said control signal and to generate an intermediate signal having first and second current levels corresponding to said first and second voltage levels, and a current-to-voltage converter operable to receive said intermediate signal and to generate an output signal having third and fourth voltage levels corresponding respectively to said first and second voltage levels, an absolute value of a second difference between said third and fourth voltage levels being comparable to said digital signal voltages, wherein said reference voltage level is approximately 500 volts.

* * * * *